United States Patent
Jiang et al.

[19]

[11] Patent Number: 6,163,957
[45] Date of Patent: Dec. 26, 2000

[54] MULTILAYER LAMINATED SUBSTRATES WITH HIGH DENSITY INTERCONNECTS AND METHODS OF MAKING THE SAME

[75] Inventors: Hunt Hang Jiang, San Jose; Thomas Massingill, Scotts Valley; Mark Thomas McCormack; Michael Guang-Tzong Lee, both of San Jose, all of Calif.

[73] Assignee: Fujitsu Limited, Japan

[21] Appl. No.: 09/192,003

[22] Filed: Nov. 13, 1998

[51] Int. Cl.$^7$ ...................................................... H01K 3/10
[52] U.S. Cl. .................. 29/852; 29/830; 29/853; 174/36; 174/262; 174/263; 428/457; 428/458; 428/901
[58] Field of Search .............................. 29/852, 830, 863, 29/839, 853; 174/36, 262, 263; 428/212, 901, 909, 195, 210, 413, 457, 458, 473.5

[56] References Cited

U.S. PATENT DOCUMENTS

| | | | |
|---|---|---|---|
| 4,301,324 | 11/1981 | Kumar et al. | 174/68.5 X |
| 4,928,387 | 5/1990 | Mather et al. | 29/840 |
| 5,046,238 | 9/1991 | Daigle et al. | 29/830 |
| 5,129,142 | 7/1992 | Bindra et al. | 29/852 X |
| 5,374,469 | 12/1994 | Hino et al. | 428/209 |
| 5,379,515 | 1/1995 | Kondo et al. | 29/852 |
| 5,401,913 | 3/1995 | Gerber et al. | 174/264 |
| 5,406,459 | 4/1995 | Tsukamoto et al. | 361/768 |
| 5,470,693 | 11/1995 | Sachdev et al. | 430/315 X |
| 5,480,503 | 1/1996 | Casey et al. | 156/89 X |
| 5,497,545 | 3/1996 | Watanabe et al. | 29/830 X |
| 5,539,153 | 7/1996 | Schwiebert et al. | 174/260 |
| 5,601,678 | 2/1997 | Gerber et al. | 156/150 X |
| 5,667,132 | 9/1997 | Chirovsky et al. | 228/180.22 X |
| 5,779,836 | 7/1998 | Kerrick | 156/150 X |

OTHER PUBLICATIONS

Masakazu, et al., "Development of Multilayer Wiring Board by Simultaneous Stacking Method of Tape Film," Erekutoronikusu Jisso Gakkaishi (Journal of the Japan Institute of Electronics Packaging), vol. 1, No. 2, pp. 124–129, 1998.

Primary Examiner—Jessica J. Harrison
Assistant Examiner—Binh-An Nguyen
Attorney, Agent, or Firm—Coudert Brothers

[57] ABSTRACT

Multilayer circuit lamination methods and circuit layer structures are disclosed which enable one to manufacture high-density multichip module boards and the like at lower cost, with higher yield, with higher signal densities, and with fewer processing steps.

19 Claims, 4 Drawing Sheets

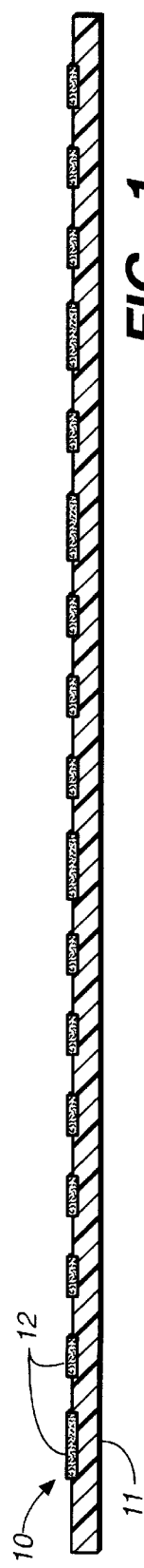
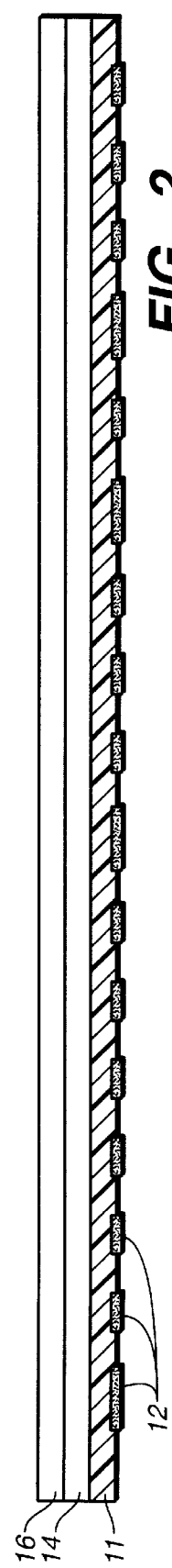
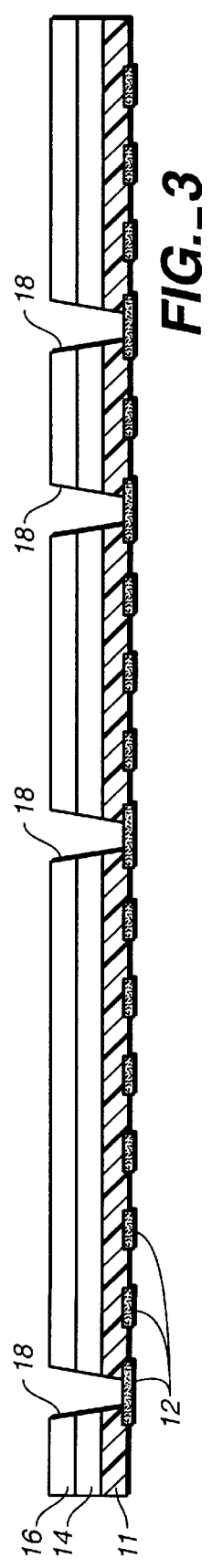
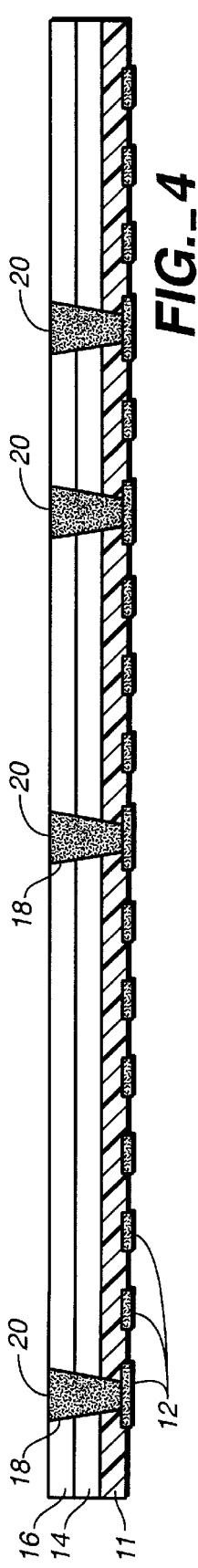

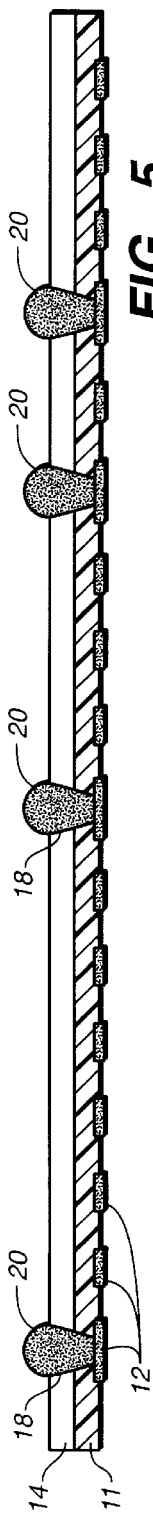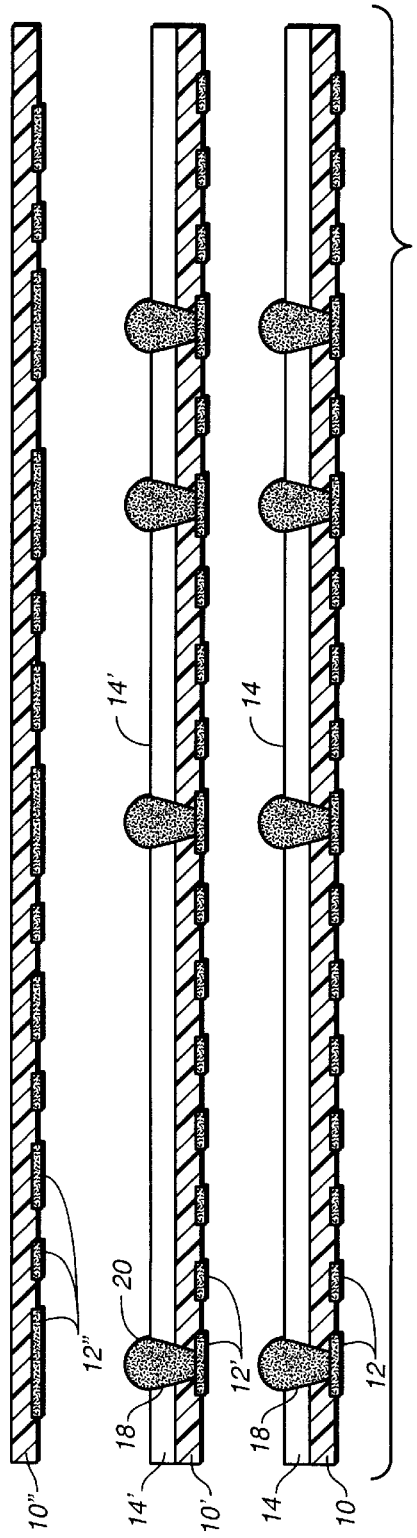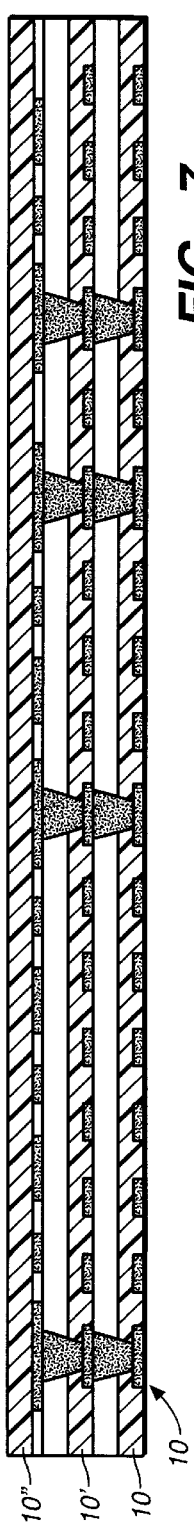

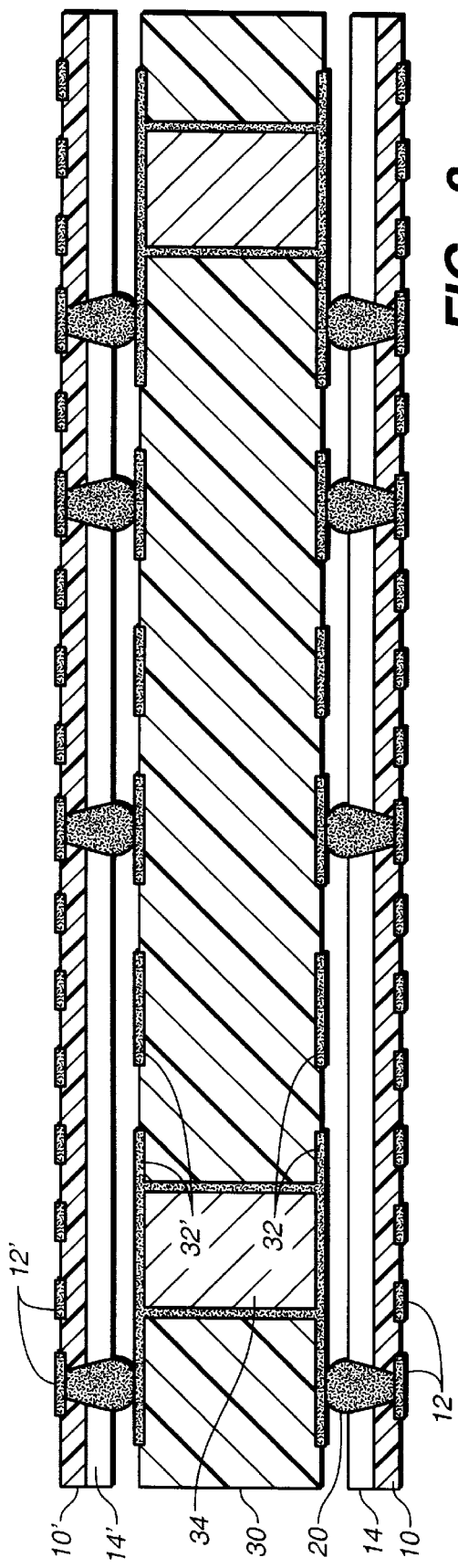
FIG._8
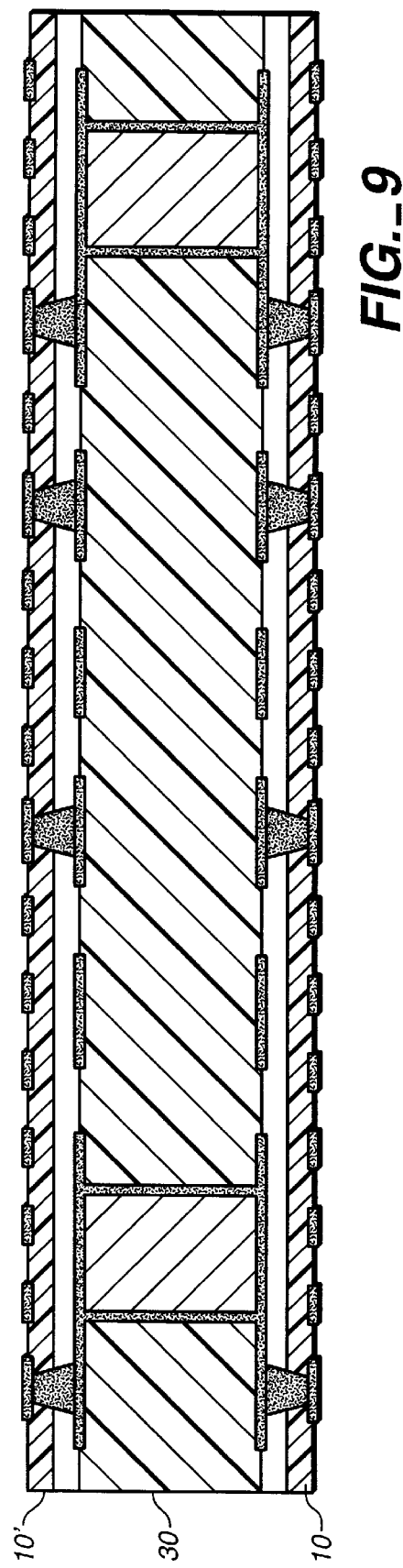
FIG._9

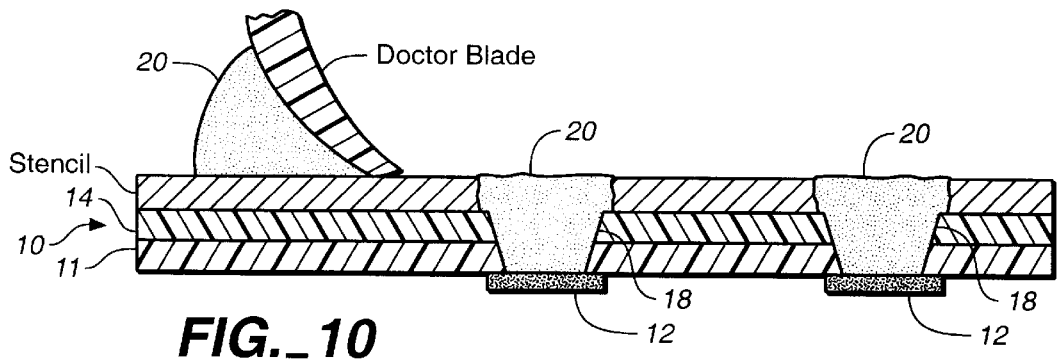
FIG._10
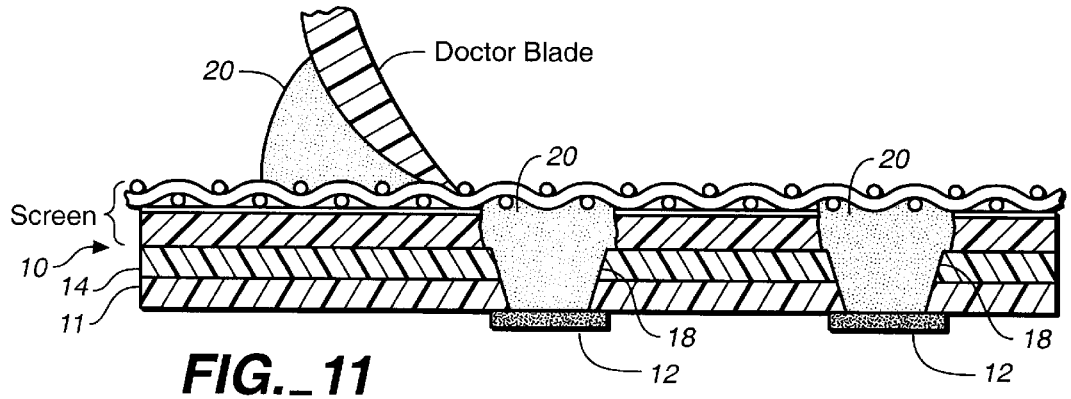
FIG._11

MULTILAYER LAMINATED SUBSTRATES WITH HIGH DENSITY INTERCONNECTS AND METHODS OF MAKING THE SAME

FIELD OF THE INVENTION

The present invention relates to multi-layer circuit boards and methods for manufacturing them. The circuit boards of the present invention may be used in a wide range of electronic applications, from flexible circuit boards to multichip module (MCM) substrates.

BACKGROUND OF THE INVENTION

Multichip module (MCM) substrates are used to interconnect a large number of integrated circuit chips. These boards typically have to convey a large number of signal lines between the chips. For this purpose, a typical MCM board has several layers of signal lines separated by interleaving dielectric layers, and via connections running through one or more dielectric layers perpendicular to the layer surface, as required by the specific electric interconnect network of the MCM. The signal and dielectric layers are manufactured in a "built-up" process where these thin layers are sequentially formed on a base substrate using conventional semiconductor processing techniques. Dielectric layers are typically formed by the sequential steps of spin-coating the dielectric material, curing, pattern-etching with a plasma etch process to form via apertures, and filling the apertures by electroplating or sputtering. The metal layers are typically formed by sequential steps of sputtering a thin chromium layer (for adhesion to the dielectric layer), sputtering a initial copper layer over the chromium layer, defining the electrical traces by either additive or subtractive methods, and removing the excess copper and chromium between the electrical traces. Typical additive methods use a thin initial copper layer (called a seed layer), then form a photoresist layer over the thin copper layer and pattern it to remove photoresist where the signal traces are to be located, and thereafter plate a much thicker copper layer into the photoresist pattern. Typical subtractive methods use a thick initial copper layer, then form a photoresist layer over the thick copper layer and pattern it to remove photoresist where the signal traces are not to be located. Thereafter exposed copper is etched away.

The build up process involves many steps and is expensive. A defect in the formation of one layer ruins the entire substrate. Current trends in the industry are toward increasing the density of signal lines and vias. This, in turn, increases cost of the build-up process and increases the chances of a defect occurring.

The present invention is directed to substrate structures and methods for making the same which reduce the manufacturing costs and defects, and thus enable board manufacturers to keep pace with the current trends in the industry.

SUMMARY OF THE INVENTION

Broadly stated, the present invention comprises two or more circuitized dielectric layers (also called circuit layers) which are laminated together to form a multilayer substrate. The first dielectric layer has a top surface, a bottom surface, and patterned metal layer disposed on its top surface. A bonding sheet (also called bonding film) is adhered the bottom surface of the first dielectric layer and, in preferred embodiments, a release layer is temporarily adhered to the exposed surface (other surface) of the bonding sheet. One or more apertures are then formed by laser drilling, each aperture passing through the release layer, the bonding sheet, and the dielectric layer such that at least one aperture terminates on the patterned metal layer at the top surface of the first dielectric layer. The apertures are filled with a non-volatile conductive composition, preferably by doctor blading or screen printing. The conductive composition contacts the metal layer at the top surface of the first dielectric layer, thereby making electrical contact to it. If present, the release layer is then separated from the bonding sheet, and the first circuitized layer is laminated to the second circuitized layer by compressing the layers together while providing heat. The heat is sufficient to bond the bonding sheet to both circuitized dielectric layers and to solidify the conductive composition in the apertures.

The laser drilling through both the bonding sheet and the dielectric layer enables the first circuitized dielectric layer to be electrically connected to the second circuitized dielectric layer without the need for a patterned metal layer on both top and bottom surfaces of the first dielectric layer. This feature enables multilayer structures to be made faster and for less cost. This feature also provides perfect alignment between the bonding sheet and the first dielectric layer, and thus eliminates one set of alignment tolerances. Closer spacing of apertures and signal lines, and higher signal densities, are thereby enabled.

The use of the conductive composition filled within the apertures to provide via connections between top and bottom surfaces of the first dielectric layer according to the present invention enables fast and inexpensive processes to be used to create these vias with small pitches and high densities.

The layers may be manufactured in parallel and then assembled at a final step. This results in faster turn around, lower costs, and higher yields since each layer can be inspected for defects before the final assembly step.

Accordingly, it is an object of the present invention to enable multilayer substrates to be made at lower cost.

It is another object of the present invention to enable multilayer substrates to be made with fewer processing steps.

It is yet another object of the present invention to enable multilayer substrates to have higher signal densities without a decrease in yield.

The present invention enables two or more of the above objectives to be simultaneously achieved, if so desired.

These and other objects of the present invention will become apparent to those skilled in the art from the following detailed description of the invention, the accompanying drawings, and the appended claims.

BRIEF DESCRIPTION OF THE DRAWINGS

FIGS. 1 through 7 show exemplary cross-sections of circuit layers according to the present invention being processed by methods according to the present invention to form a first general type of multilayer substrate according to the present invention.

FIGS. 8 and 9 show exemplary cross-sections of circuit layers according to the present invention being processed by methods according to the present invention to form a second general type of multilayer substrate according to the present invention.

FIGS. 10 and 11 show exemplary cross-sections of circuit layers according to the present invention being processed by additional methods according to the present invention to form the aforesaid first general type of multilayer substrate according to the present invention.

DETAILED DESCRIPTION OF THE INVENTION

FIGS. 1–7 show a first general embodiment of a substrate according to the present invention during selected processing steps according to a first general exemplary embodiment of the methods according to the present invention. Referring to FIG. 1, the method and substrate start with a first circuit layer 10 which comprises a dielectric layer 11 and a pattern metal layer 12 formed on the top surface of dielectric layer 11. In preferred implementations, dielectric layer 11 comprises a flexible polyimide film (e.g., KAPTON from DuPont, or UPILEX from Ube Industries, Ltd.) having a thickness anywhere in the range of 12.5 μm to 200 μm, with thicknesses in the range of 12.5 μm to 50 μm being preferred for high-density signal line applications. Layers which are thicker than 200 μm and/or more rigid than the above polyimide examples may be used for low signal density applications. Metal layer 12 is preferably formed on layer 11 by first sputtering a thin adhesion layer (200 Å to 400 Å) of chromium (Cr) or nickel-copper alloy (Ni/Cu), and then sputtering a thin copper (Cu) seed layer (0.25 μm to 1 μm). Circuit signal traces and connection pads for vias are then formed in layer 12 by forming a photoresist layer over the initially sputtered adhesion and copper layers, then patterning the photoresist to remove resist where the traces and pads are to be formed, and thereafter electroplating copper material on the portions of the sputtered copper layer that are left exposed by the photoresist layer. In this way, the photoresist is used as a mold within which copper is electroplated to form the traces and pads. The photoresist is typically a laminate sheet (e.g., RISTON from DuPont), which is laminated to the copper seed layer. 5 μm to 8 μm of copper material is typically plated. After the plating step, the photoresist layer is removed, then a copper etch is performed to etch away the copper seed layer where it is not desired (this also etches some, but not all, of the desired copper for the traces). Finally, the exposed chromium layer is etched away. This additive method for forming the signal traces and pads enables very fine lines and pad features to be formed, much finer than that achieved by conventional subtractive processes.

For applications where fine line features are not needed, a subtractive method may be used to form the signal traces and via pads in layer 12. In this case, a copper foil is usually laminated to dielectric layer 11 (this may employ an adhesive to do so). Preformed copper-clad dielectric layers are also available. A photoresist layer is formed over the copper layer and patterned to leave resist where the traces and pads are to be formed. The photoresist may be formed by laminating a photoresist sheet (e.g., RISTON), or formed by spray-coating, screening, or curtain-coating a liquid photoresist. A copper etch is then performed with a copper chemical etchant. The photoresist layer is then removed. Instead of using a laminated copper foil, one may sputter an adhesion layer and a copper seed layer on dielectric layer 11, and then plate thick copper layer of 5 μm to 8 μm. However, this approach is currently more expensive than using a laminated copper foil.

As used herein, the term connection pad means any portion of the metal layer 12 that is intended to receive a via connection or to serve as a connection pad to an external component, such as integrated circuit chip, interconnection pin, or larger interconnection substrate. Signal traces are those portions of metal layer 12 which traverse between connection pads.

Having formed layer 10 or otherwise procured it, the next step in the exemplary manufacturing process is to form or adhere a bonding sheet or film 14 onto the back surface of layer 10, the result of which is shown in FIG. 2. The bonding sheet 14 may be formed by screen printing, spraying coating, or curtain coating a blanket layer of a liquid adhesive on the bottom surface of layer 10 and thereafter soft baking the layer to remove the solvents in the liquid adhesive. As used herein, soft baking is the act of exposing such an adhesive material to a temperature which is above room temperature (25° C.) for more than one minute without significantly diminishing the adhesive capability of the material. Spray coating and curtain coating are advantageous in conveyor transport manufacturing implementations. The liquid adhesive may be a thermosetting resin or thermoplastic resin. The soft bake operation would remove solvents from the thermosetting and thermoplastic resins, if such were mixed in the resin at the time of formation. For B-stage resins (which are generally thermosetting resins), the soft bake operation is preferably used to bring the resin to its B-stage state. Examples of such B-stage resins are provided below.

The bonding sheet 14 may also be a preformed sheet which is tack laminated to layer 10. Such preformed bonding sheets are suitable for piece handling assembly implementations (i.e., non-conveyor transport implementations), and will be used herein to illustrate the invention without loss of generality. In many cases, bonding sheets are sold with a protective release layer adhered to one surface of the bonding sheet, and sometimes sold with two release layers adhered to respective surfaces of the bonding sheet. When a bonding sheet is tack laminated to layer 10, the release layer is removed if it is present on the surface to be bonded. A release layer is maintained on the other surface of bonding sheet 14, and is indicated by reference number 16 in the figures. If release layer 16 is not sold with bonding sheet 14, then one may be readily added by tack lamination. Release layer 16 prevents bonding sheet 14 from adhering to the lamination press during the tack lamination of sheet 14 to layer 10.

Preformed bonding sheets may comprise filled-resin sheets, pre-impregnated ("prepreg") sheets, and the like. A typical filled resin sheet comprises a mixture of a pure (uncured) resin and filler material which is roll pressed in the shape of a sheet. In the typical case, the pure resin is capable of being partially curing to the B-stage (so called "B-stageable" resin). The resin may comprise a multifunctional epoxy, bismaleimide triazine (BT), cynate ester, polyimide, etc. A pre-impregnated ("prepreg") sheet comprises a fibrous base sheet which has its surfaces coated with a pure resin, such as any of the resins use in filled-resin sheets. If a prepreg sheet is used in practicing the present invention, the fibrous base sheet is preferably non-woven; aramid fiber reinforced "prepreg" sheet and liquid crystal polymer (LCP) fiber reinforced "prepreg" are preferred choices since they provided excellent laser-drilling results. A release layer may comprise films of polyimide, polyester, mylar, aluminum, etc. Release layers generally range in thickness between 12.5 μm and 25 μm, and can be easily remove, or separated, by pealing from one edge. Exemplary bonding sheets are: Mitsubishi BT bonding film BT F346, Mitsubishi LCP reinforced BT prepreg GMPL-195, Nippon Steel polyimide bonding sheet SPB-A, and Shin-etsu epoxy bonding sheets types E31 through E38. Each of these examples are thermosetting bonding sheets which comprise epoxy which has been gelled to the B-stage.

A preformed bonding sheet 14 may be adhered to layer 10 by tack lamination. In tack lamination, the bonding sheet is heated to a temperature which softens it, but does not cure the pure resin in the bonding sheet. The softening of the bonding sheet enables it to adhere to another layer, such as layer 10. The tack lamination is done by first removing the release layer which covers the surface to be tack laminated, if present, and maintaining the release layer 16 on the other surface in place. The tack lamination may be accomplished by compressing the three layers 10, 14, and 16 at an elevated temperature which moderately softens the bonding sheet (usually slightly over the B-stage temperature point for B-stage bonding sheets) for a short period of time. A low amount of compression in the range of 50 psi to 150 psi is used, and the tack bonding is done under a vacuum, which is the common practice in the lamination art (psi=pounds per square inch). As an example, if one uses the Nippon Steel SPB-A sheet, a tack lamination may be performed at 100° C. for 5 minutes and at a compression pressure of 100 psi. They inventors have successfully practiced the present invention with a Wabash VS75H-24 hydraulic vacuum press.

As used herein, the step of "tack laminating" a thermosetting bonding sheet comprises the step of compressing the bonding sheet against another layer or substrate while heating the bonding sheet to the point which softens it but does not cure it, or cause it to lose its full bonding strength. Bonding strength may be measured by peal strength. As used herein, the step of "tack laminating" a thermoplastic bonding sheet comprises the step of compressing the bonding sheet against another layer or substrate while heating the bonding sheet to the point which softens it but does cause it to be bonded to the other sheet by more than 20% of its full bonding strength. As used herein, a "tack laminated bond" between a bonding sheet and another layer or substrate is an adherence in which the peal strength between the bonding sheet and the other layer is less 20% of the maximum peal strength that can be achieve between the two layers.

In the next step, via apertures will be formed through all three layers 10, 14, and 16 by laser drilling. Because of the properties of laser drilling, metallic release layers are not preferred for layer 16. In addition, polyester release layers are not preferred for layer 16 when drilling apertures of small diameter (e.g, smaller than 100 $\mu$m). Polyimide release layers are preferred for small diameters since this material produces more vertical sidewalls in the laser drilling process. If small diameters are to be formed, a polyester release layer may be replaced with a polyimide release layer by pealing off the polyester layer and tack laminating a polyimide layer. Such a replacement is preferably done before the tack lamination of bonding sheet 14 to layer 10.

The next step is to laser drill a plurality of apertures 18, each of which passes through release layer 16, bonding sheet 14, and dielectric layer 11 of layer 10, and which terminates on a pad of the metal layer 12. The result of this step is shown in FIG. 3. Apertures 18 are called blind vias, and each aperture 18 is self-aligning through all three layers 11, 14, and 16. A YAG-UV laser, Excimer laser, or $CO_2$ laser may be used, and each can achieve minimum aperture diameters of 50 $\mu$m. The apertures 18 may have diameters in the range of 50 $\mu$m to 250 $\mu$m in typical applications. (If bonding sheet 14 has been formed by screen printing, spray coating, or curtain coating a liquid adhesive, a release layer can be tack laminated onto the exposed surface of bonding sheet 14 before the laser drilling step. For conveyor transport implementations, hot-roll press lamination may be used to tack laminate the release layer.)

If a $CO_2$ laser is used, it is usually necessary to clean aperture 18 with a plasma cleaning operation. An exemplary plasma cleaning comprises a gas at 250 millitorr having 70% $CF_4$ (carbon tetrafluoride) and 30% $O_2$ (oxygen), an etch time of 5 minutes, and a power level suitable for non-etch cleaning. (The power level will depend upon the particular machine model, and such information is provided by the manufacturer or can easily found by testing by those of ordinary skill in the art). After five minutes, the gas composition is changed to 100% $O_2$, and continued for another five minutes at the same pressure and power level. A gas pressure in the range of 100 millitorr to 300 millitorr may generally be used in both etch periods.

If a YAG-UV laser or an Excimer laser is used, plasma cleaning is generally not required, but nonetheless may be used to ensure high yield. In general, the YAG-UV laser is preferred because it has a higher yield of defect-free drilled apertures, and because it does not require a subsequent plasma cleaning. With YAG-UV and Excimer lasers, it is advisable to control the power level such that the laser does not drill through the metal pad (e.g., copper) of layer 12. The level can be readily found by one of ordinary skill in the art by testing various power levels, and many manufacturers of laser-drilling equipment provide power guidelines for various drilling applications.

As the next step in the exemplary process, apertures 18 are filled with a non-volatile conductive composition 20 while release layer 16 is still in place, as shown in FIG. 4. The conductive composition is applied in a slurry or paste-like form, and is subsequently treated in a later step to cause it to solidify. The filling is preferably done by running a doctor blade or squeegee over the surface of release layer 16 with conductive composition 20 disposed along its leading edge. The conductive composition is referred to as being non-volatile since it emits negligible gas when heated to its solidification temperature or the curing temperature of bonding sheet 14, whichever is higher. By negligible gas emission, we mean that the conductive composition does not emit more than 2% of its weight in vapor form when heated to the higher curing temperature. This feature of the present invention prevents the composition from generating gases which would prevent two circuit layers according to the present invention from being laminated together. Emitted gas of substantially more than 2% by weight can create gas bubbles between the laminated layers, which would reduce reliability of the laminated substrate.

Conductive composition 20 may comprise a number of solvent-free, metal-filled epoxies, and in particular silver pastes, which are well known to the art. The inventors have practiced the invention with the following silver paste: EPO-TEK E3114-PFC and EPO-TEK E2101 silver pastes manufactured by Epoxy Technologies, Inc.

In preferred embodiments, a conductive composition as provided below is used for composition 20:

*91 parts by composition weight of Pb—Sn solder powder, having 37 weight percent lead and 63 weight percent tin, and particle sizes less than about 20 microns (i.e., type 6 Pb—Sn solder),

*4.75 parts of the solvent: di(propylene glycol) methyl ether acetate,

*4.25 parts by composition weight of a liquid carrier which itself comprising 74 parts by weight of Heloxy® 505 resin (Shell Chemical Co.), 15 parts by weight of cinnamic acid, and 11 parts by weight of MHTPA (methyl-tetrahydrophthalic anhydride).

The carrier is formed by first dissolving the solid cinnamic acid in the resin by heating these two components together to 140° C. The two components are then cooled to room temperature, and the MHTPA is added. The solvent and the liquid carrier are mixed together, after which the solder powder is added. The solder particles of this composition have a melting point of 183° C., and the composition is typically reflowed at a temperature in the range of 195° C. to 215° C. for 3–5 minutes. After the conductive composition is dispensed in apertures 18, but before the composition is raised to the reflow temperature (i.e., the solidification temperature), the composition is soft baked to remove substantially all of the solvent (preferably remove more than 95% of the solvent). An exemplary soft bake step is described below. Upon reflow, the solder particles will coalesce together to form a single body which will form a metallurgical bond to the metal pad of layer 12 at the bottom of aperture 18. The cinnamic acid acts to flux the solder particles and the metal pad. During reflow, the resin will have a very low viscosity and will be expelled to the outer periphery of the composition mass as the solder particles coalesce. Within 1–2 minutes after reaching the reflow temperature, and after being expelled to the outer periphery, the resin will begin to gel. The gelling of the resin encapsulates the fluxing byproducts generated from the cinnamic acid, as well as any unused portion of the cinnamic acid. The aforementioned pending patent application describes additional conductive compositions which may be used with the present invention. In place of the eutectic lead-tin solder powder, the other following solder powders may be used (their melting points are indicated in parenthesis):

- a 96.5% tin (Sn)—3.5% silver (Ag) (melting point=221° C.),
- a 95% tin (Sn)—5% antimony (Sb) (melting point=232° C.–240° C.),
- an 80% gold (Au)—20% tin (Sn) solder powder (melting point=280° C.).

While these conductive compositions initially have solvent, they are still considered to be non-volatile compositions since they are soft baked to remove the solvent before the reflow step, and since they emit less than 2% by composition weight during the reflow (solidification) step.

In general, the minimum diameter for aperture 18 should be about twice the maximum particle size of the solder or metal powder. Thus, the minimum diameter for aperture 18 should be 50 μm for maximum particle diameters of 20 μm.

Once apertures 18 are filled with conductive composition 20, an optional soft bake operation at 60° C. to 120° C. for at least 5 minutes, and preferably at 80° C. to 100° C. for 15 to 30 minutes may be preformed. As used herein, soft baking is the act of exposing the conductive composition to a temperature which is above room temperature (25° C.) for more than one minute while not destroying the composition's ability to form an electrical connection in a subsequent lamination step. In general, the soft baking step can provide two benefits. First, the step can remove air bubbles in apertures 18 by decreasing the viscosity of the conductive composition, thereby enabling any air bubble to rise to the surface of composition 20. This is particularly effective with the above-described solder/resin conductive compositions. Second, the soft bake step can create a slight hardening of the outer skin of the conductive composition 20 before release layer 16 is removed. The slight hardening causes more of the composition to remain with layer 14 as layer 16 is pealed off. This is particularly useful for the metal-filled epoxies (e.g., silver paste), in which case the temperature may be raised up to the B-stage curing point of the epoxy. In the case where the above-described solder/resin conductive composition is used, the soft baking operation removes the solvent before the composition is reflowed.

As the next step, release layer 16 is removed from bonding sheet 14 by pealing, the result of which is shown by FIG. 5. In the present invention, release layer 16 provides several benefits. First, it protects the bonding surface of bonding sheet 14 from any ash products that may be generated from the laser drilling operation. Such ash products could impair the bonding ability of the sheet. Second, it prevents conductive composition 20 from contacting the bonding surface of sheet 14, which many also impair the bonding ability of the sheet. Third, it provides the deposition of a controlled amount of excess conductive composition 20 at the top of each aperture 18.

Furthermore, release layer 16 provides several benefits over conventional stencil printing. With stencil printing, there is the potential for misalignment, and for this reason the diameter of aperture 18 is made to be larger than the diameter of the stencil's aperture. In practice, this requires aperture 18 to be much larger than that which can be achieved by using release layer 16. In contrast, release layer 16 is perfectly aligned to aperture 18 and the portion of aperture 18 in layer 16 has the same diameter and the portion of aperture 18 in bonding sheet 14. Therefore, the minimum diameter of aperture 18 is not dependent upon release layer 16 as would be the case with a stencil, and thus layer 16 enables smaller diameters and denser packing of via apertures. Moreover, release layer 16 can be at least 12.5 μm thinner than the thinnest stencil currently available (25 μm), which enables it to fill smaller diameter vias. In addition, release layer 16 conforms better to the non-planarities of the wafer surface than a conventional stencil, and therefore reduces the variation in the amount of paste or conductive composition that is screened into a plurality of apertures 18. As a result, more uniform filling and better controllability are achieved with release layer 16, which are important factors for reliably forming high densities of small via connections with apertures 18. Also, stencils are often used several times and tend to collect contaminants on their surfaces which can be later transferred to bonding sheet 14. Such contaminants can reduce the bonding strength of sheet 14.

As the next step, bonding sheet 14 is laminated to a second circuit layer or substrate by heat pressing under vacuum such that the apertures 18 confront corresponding metal pads. The second circuit layer may be flexible circuit layer or a rigid circuit layer (also called a rigid circuit substrate). FIG. 6 shows an example where three flexible circuit layers 10, 10' and 10" are aligned before being laminated, and FIG. 7 shows the layers after the lamination step. Layers 10 and 10' have been processed according the previous steps, and have bonding sheets 14 and 14', and via apertures 18 and 18' filled with conductive composition 20. They may have the same circuit trace pattern in their metal layers 12, 12', and 12", or they may have different patterns, which is more likely the case. In either case, these layers have pads where the via apertures 18 are located. Layers 10 and 10' are oriented upside down, and such that the top of layer 10' confronts the bottom of layer 10 (the top surface of each layer is defined as that surface which has metal layer 12). Composition-filled apertures 18 of circuit layer 10 are aligned to pads of layer 12' of layer 10', and will be contacted thereto during the lamination process. Circuit layer 10" is also oriented upside-down. Composition-filled apertures 18' of circuit layer 10' are aligned to pads of layer 12" of layer 10", and will be contacted thereto during the lamination process. Manufacturers of bonding sheets generally provide recommended temperatures, times, and pressures for their products, and those recommended values may be used at this step. As an example, if one uses a Nippon Steel SPB-A sheet, a temperature of 180° C. and pressure of about 500 psi may be used for 60 minutes to bond bonding sheets 14 and 14' to layers 10, 10' and 10". The inventors have successfully practice the present invention using a Wabash VS75H-24 hydraulic vacuum press.

The present invention requires that the bonding temperature and time be chosen to enable conductive composition 20 to solidify. Metal-filled epoxies, which have metal particles which are not reflowed, can be readily solidified by raising the temperature of the composition in the range of 140° C. to 200° C. for a period of time which is generally less than an hour. In these cases, the curing time and temperature of the bonding sheet are sufficient to cause solidification of metal-filled epoxy paste compositions 20. If not, addition time lamination time can be used to ensure solidification, which generally does not ruin the bonding strength of bonding sheets 14 and 14'. In some cases, a temperature higher than the recommended value for the bonding sheet can be used without ruining the bonding strength of sheets 14 and 14'. The amount of bonding pressure for metal-filled epoxies is generally not an issue, and the amount recommended for bonding sheets 14 and 14' is usually more than sufficient to establish a connection of the metal-filled epoxy paste to both opposing pads.

If the conductive composition 20 comprises a reflowable conductive composition, then the temperature is ramped up to a peak temperature which is 5° C. to 20° C. above the melting point of the powdered metal during the first 4–8 minutes of the lamination process, and then is ramped down over the next about 5 minutes to a lower temperature suitable for effecting the bonding of the bonding sheet. For the above-described solder/resin composition example which has a melting point of 183° C., the peak temperature (also called the reflow temperature of the solder powder) is preferably set at about 200° C. For these compositions, a lamination pressure of at least 50 pounds per square inch (psi) is used. For compositions which reflow below about 220° C., a lamination pressure of between 300 psi and 600 psi is generally used. In the example above, a pressure of 500 psi was used. For compositions which reflow above 220° C., a lower lamination pressure of between 100 psi and 400 psi is generally used. After the first initial 5 minutes, the temperature is changed to the value recommended for laminating bonding sheet 14.

The multilayer substrate which results from the lamination process is shown at 100 in FIG. 7.

Layer 10 may also be laminated to a rigid substrate in a similar manner, as shown in FIGS. 8 and 9. FIG. 8 shows layers 10 and 10' aligned to respective surface of a rigid substrate 30, which has corresponding connection pads formed in metal layers 32 and 32'. Substrate 30 have conventional through-hole vias 34, which have diameters much larger than the minimum via diameter that can be achieved by the present invention.

As with all lamination processes, it is advantageous to select layers which have coefficients of thermal expansion (CTE) which are close to one another.

A second exemplary example is now provided using a thermoplastic bonding sheet 14, which can be laminated in less time than a thermosetting bonding sheet. Several thermoplastic bonding sheets are commercially available, such as DuPont's KAPTON-KJ and KAPTON-EKJ. Here, we illustrate the example using KAPTON-EKJ, which has a core polyimide layer (which has already been thermoset) and two outside layers of a thermoplastic adhesive (EKJ adhesive) at either surface of the core polyimide layer. The thermoplastic adhesive begins to melt at 275° C., and forms a good adhesion at 300° C. It can be tack laminated to other layers at 240° C. for 1 minute, at a compression of 100 psi and in a vacuum environment. A polyimide release layer 16 is tack laminated onto the KAPTON-EKJ bonding sheet 14, and the bonding sheet 14 is tack laminated onto layer 10 using the above provided tack lamination temperature, time, and pressure. Next, apertures 18 are formed by laser drilling using the methods previously described, and a plasma cleaning is performed, if necessary. Next, the reflowable solder/resin conductive composition described above is screened into apertures 18, with release layer 16 in place. In this example, a gold-tin (80Au/20Sn) solder powder is used in place of the lead-tin solder powder. The gold-tin solder powder has a melting point of 280° C. As before, the solvent is removed before the lamination step by the previously-described soft bake step. Release layer 16 is removed, and bonding sheet 14 is laminated to a second circuit layer or circuit substrate. A lamination pressure of about 300 psi to 400 psi is used with a vacuum, and the temperature is ramped from room temperature up to 300° C. within 5 to 10 minutes, and then cooled down to room temperature gradually over a period of about 30 minutes. The thermoplastic film does not require a curing stage, as in the case of thermosetting bonding sheets, and can therefore be laminated more quickly.

While copper material for the pads of metal layers 12, 12', 12", 32, and 32' has been used to illustrate the present invention, it may be appreciated that other metals may be used, and that the surface of the pads may be coated with other metal systems. For example, the copper pads may be coated with a nickel layer, a lead layer, a tin layer, and a nickel layer followed by a gold layer. These layer coatings can be plated by electrolytic plating (before etching away the seed layer for layer 12). They may also be plated by electroless plating, which may occur before bonding sheet 14 is laminated, or after the plasma cleaning step, or after the laser drilling step if no plasma cleaning step is used.

From the above-described methods, it may be appreciated that a multilayer substrate is formed which comprising a first circuit layer and a second circuit layer, each having a first surface, a second surface, and at least one electrical pad disposed on its first surface; a bonding layer disposed between the second surface of said first circuit layer and the first surface of said second circuit layer and adhered to both said first and second circuit layers; with an aperture which passes through the bonding layer and the first circuit layer, with a solidified conductive composition disposed within the aperture. The aperture terminates on the pad at the first surface of the first circuit layer, and has continuous sidewalls at the interface between the bonding layer and the first circuit layer due to the self-align of the laser drilling step (in other words, there is no misalignment between the two layers along the walls of the aperture. The conductive composition is disposed in the aperture in a paste, non-solid form, and then solidified. As such, it is a non-plated material.

There are many novel and unconventional features of the present invention which enable the low-cost construction of multilayer interconnect substrates having high-signal density. The drilling of the apertures through bonding sheet 14 and circuit layer 10 from the bottom surface of circuit layer 10 and terminating on the top surface of the same circuit layer is novel and unconventional. Bonding sheets are normally used in low-signal density applications and are usually pre-punched before being laminated to a circuit board. The drilling through both bonding sheet 14 and circuit layer 10 enables the first circuit layer 10 to be electrically connected to the second circuit layer (10' or 30) without the need for a patterned metal layer on both top and bottom surfaces of the first circuit layer 10. Since the time and cost of forming patterned metal layers on both surfaces of a layer 10 and interconnecting those metal layers is more than twice the cost of forming a metal layer on one surface, and since the resulting yield is lower, the structure and processing of the first circuitized layer 10' according to the present invention reduces costs and manufacturing time.

The laser drilling of both first circuit layer 10 and bonding sheet 14 at essentially the same time provides perfect alignment between the two layers, and thus eliminates one set of alignment tolerances. This, in turn, enables closer spacing of apertures 18 and signal lines, and higher signal densities, with respect to the case where a bonding sheet would be pre-punched and subsequently aligned and laminated to a circuitized dielectric layer. As is known in the art, an alignment tolerance must be provided for each non-self aligning processes to account for mis-alignment between patterns in the two layers being aligned. In the worse case, it is assume that all of the alignment tolerance constructively add, and that the minimum spacing distance between vias and signals lines must factor in the worst case cumulative mis-alignment.

As another novel and beneficial feature of the present invention, the drilling of the release layer 16 essentially at the same time as bonding sheet 14 and first layer 10 provides perfect alignment between release layer 16 and the other two layers. Release layer 16 enables a non-precise screening or blading operation to be used to fill the apertures with conductive composition since unwanted excess is removed with the subsequent removal of the release layer. This enables a very inexpensive deposition process to be used, and eliminates another set of alignment tolerances. Thus, the formation of high-density vias in apertures 18 may be formed at a relatively low cost, and in a relatively short period of time. For applications having low-density of vias (i.e., apertures 18), release layer 16 can be omitted, and the conductive composition may be stenciling screen printed into apertures 18, as shown in FIGS. 10 and 11, respectively. While this modification does not enable one to achieve the highest possible density of vias, it does enable one to achieve the cost savings and faster productions times of the present invention.

The use of the conductive composition within the apertures to provide via connections between the top and bottom surfaces of the circuitized layer 10 is also novel and provides benefits. It is considerably faster and less expensive than conventional sputtering and electroplating filling operations. Not only are these conventional via filling operations time consuming, they often require additional etch-back or polishing planarization steps to remove excess material. No such steps are require in the present invention. An advantage of the release layer is that it provides a repeatable and controlled amount of excess conductive composition at the top of each via. The excess amount ensures contact with an opposing metal pad of the second dielectric layer, when the first and second dielectric layers are laminated together. During the lamination process, the excess composition is generally pushed down into the aperture, which causes the side walls of the aperture to expand outward (particularly in region of the bonding sheet). Thus, the excess composition generally does not flow out of the aperture during lamination.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of making a multilayer substrate from a first circuit layer and a second circuit layer, each circuit layer having a first surface, a second surface, and at least one electrical pad disposed on its first surface, the method comprising:
   (a) tack laminating a bonding sheet onto the second surface of the first circuit layer by heat pressing, the bonding sheet having a first surface bonded to the second surface of the first circuit layer and a second surface, the bonding sheet further having a release layer releaseably adhered to the second surface of the bonding sheet;
   (b) laser drilling an aperture which passes through the release layer, the bonding sheet, and the first circuit layer and which terminates on a pad at the first surface of the first circuit layer;
   (c) filling the aperture with a non-volatile conductive composition with the release layer adhered to the bonding sheet, the conductive composition contacting the pad of the first circuit layer;
   (d) removing the release layer from the bonding sheet; and
   (e) laminating the bonding sheet to the first surface of the second circuit layer by heat pressing such that the aperture confronts a pad of the second circuit layer, and such that the conductive composition forms an electrical connection between the pad of the first circuit layer and the pad of the second circuit layer.

2. The method of claim 1 further comprising the step of exposing the laser drilled aperture to a plasma cleaning before the aperture is filled with the conductive composition.

3. The method of claim 1 further comprising the step of exposing the filled aperture to a step of soft baking before the release layer is removed from the bonding sheet.

4. The method of claim 3 wherein the step of soft baking comprises heating the filled aperture to temperature above 60° C. for at least 5 minutes.

5. The method of claim 3 wherein the step of soft baking comprises heating the filled aperture to temperature between about 80° C. and about 100° C. for at least about 15 minutes.

6. A method of making a multilayer substrate comprising:
   (a) providing a first circuit layer having a first surface, a second surface, at least one electrical pad disposed on its first surface, and a bonding sheet disposed on second surface of the first circuit layer, the bonding sheet having a first surface adjacent to the second surface of the first circuit layer, a second surface, and a release layer releasably adhered to the second surface of the bonding sheet;
   (b) laser drilling an aperture which passes through the release layer, the bonding sheet, and the first circuit layer and which terminates on a pad at the first surface of the first circuit layer;
   (c) filling the aperture with a non-volatile conductive composition with the release layer adhered to the bonding sheet, the conductive composition contacting the pad of the first circuit layer;
   (d) removing the release layer from the bonding sheet to expose the second surface of the bonding sheet; and (e) laminating the second surface of the bonding sheet to a second circuit layer such that the aperture confronts a pad disposed on the second circuit layer, and such that the conductive composition forms an electrical connection between the pad of the first circuit layer and the pad of the second circuit layer.

7. The method of claim 6 further comprising the step of exposing the laser drilled aperture to a plasma cleaning before the aperture is filled with the conductive composition.

8. The method of claim 6 further comprising the step of exposing the filled aperture to a step of soft baking before the release layer is removed from the bonding sheet.

9. The method of claim 8 wherein the step of soft baking comprises heating the filled aperture to temperature above 60° C. for at least 5 minutes.

10. The method of claim 8 wherein the step of soft baking comprises heating the filled aperture to temperature between about 80° C. and about 100° C. for at least about 15 minutes.

11. A method of making a multilayer substrate from a first circuit layer and a second circuit layer, each circuit layer having a first surface, a second surface, and at least one electrical pad disposed on its first surface, the method comprising:

(a) forming a bonding layer on the second surface of the first circuit layer, the bonding layer having a first surface adhered to the second surface of the first circuit layer and a second surface;

(b) laser drilling an aperture which passes through the bonding layer and the first circuit layer, and which terminates on a pad at the first surface of the first circuit layer;

(c) filling the aperture with a non-solid non-volatile conductive composition such that the conductive composition contacts a pad of the first circuit layer previously exposed by the aperture, and such that a portion of the conductive composition extends outside of the aperture; and (d) laminating the bonding layer to the first surface of the second circuit layer by heat pressing such that the aperture confronts a pad of the second circuit layer, and such that the conductive composition solidifies and forms an electrical connection between the pad of the first circuit layer and the pad of the second circuit layer.

12. The method of claim 11 wherein said step of forming the bonding layer comprises the step of spraying an adhesive material.

13. The method of claim 11 wherein said step of forming the bonding layer comprises the step of curtain coating an adhesive material.

14. The method of claim 11 wherein said step of forming the bonding layer comprises the step of screen printing a blanket layer of an adhesive material.

15. The method of claim 11 wherein said step of forming the bonding layer comprises the step of tack laminating a bonding sheet to the second surface of the first circuit layer.

16. The method of claim 11 further comprising the step of tack laminating a release layer onto the exposed surface of the bonding layer before laser drilling the aperture, and the step of removing the release layer after filling the aperture with the conductive composition, and wherein said step of laser drilling comprise the step of laser drilling the aperture such that is passes through the release layer as well as the bonding layer and the first circuit layer.

17. The method of claim 16 wherein the step of filling the aperture with conductive composition comprises the step of doctor blading the composition over the surface of the release layer.

18. The method of claim 11 wherein the step of filling the aperture with conductive composition comprises the step of screen printing the conductive composition.

19. The method of claim 11 wherein the step of filling the aperture with conductive composition comprises the step of placing a stencil over the bonding layer and depositing the conductive composition through the stencil.

* * * * *

CERTIFICATE OF CORRECTION

PATENT NO: 6,163,957

DATED: December 26, 2000

INVENTOR(S): Jiang, et al.

Column 12, line 19:     delete "releaseably" and substitute therefor --releasably;--.
Column 12, line 56:     delete "releaseably" and substitute therefor --releasably;--.

Signed and Sealed this

First Day of May, 2001

Attest:

NICHOLAS P. GODICI

Attesting Officer      Acting Director of the United States Patent and Trademark Office